United States Patent
Low et al.

(10) Patent No.: US 8,685,846 B2
(45) Date of Patent: Apr. 1, 2014

(54) TECHNIQUE FOR PROCESSING A SUBSTRATE

(75) Inventors: Russell J. Low, Rowley, MA (US); William T. Weaver, Austin, TX (US); Nicholas P. T. Bateman, Reading, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 828 days.

(21) Appl. No.: 12/695,729

(22) Filed: Jan. 28, 2010

(65) Prior Publication Data

US 2010/0197125 A1 Aug. 5, 2010

Related U.S. Application Data

(60) Provisional application No. 61/148,455, filed on Jan. 30, 2009.

(51) Int. Cl.
*H01L 21/425* (2006.01)

(52) U.S. Cl.
USPC .................................. 438/514; 257/E21.346

(58) Field of Classification Search
USPC .................................. 438/514; 257/E21.346
See application file for complete search history.

(56) References Cited

U.S. PATENT DOCUMENTS

2008/0149856 A1 6/2008 Low

FOREIGN PATENT DOCUMENTS

| JP | H09-102466 A | 4/1997 |
| JP | 2001-229872 A | 8/2001 |

*Primary Examiner* — Julio J Maldonado
*Assistant Examiner* — Amar Movva (57) ABSTRACT

An improved technique for processing a substrate is disclosed. In one particular exemplary embodiment, the technique may be realized as a method for processing a substrate. The method may comprise ion implanting a substrate disposed downstream of the ion source with ions generated in an ion source; and disposing a first portion of a mask in front of the substrate to expose the first portion of the mask to the ions, the mask being supported by the first and second mask holders, the mask further comprising a second portion wound in the first mask holder.

14 Claims, 5 Drawing Sheets

TECHNIQUE FOR PROCESSING A SUBSTRATE

PRIORITY

This application claims priority under 35 U.S.C. 119(e)(1) to U.S. Provisional Patent Application Ser. No. 61/148,455, filed on Jan. 30, 2009, entitled "Reel-to-Reel Mask." The entire specification of U.S. Patent Application Ser. No. 61/148,455 is incorporated herein by reference.

FIELD

The present disclosure relates to a technique for processing a substrate, more particularly to a technique for manufacturing processing a substrate using a mask.

BACKGROUND

Figure 1:
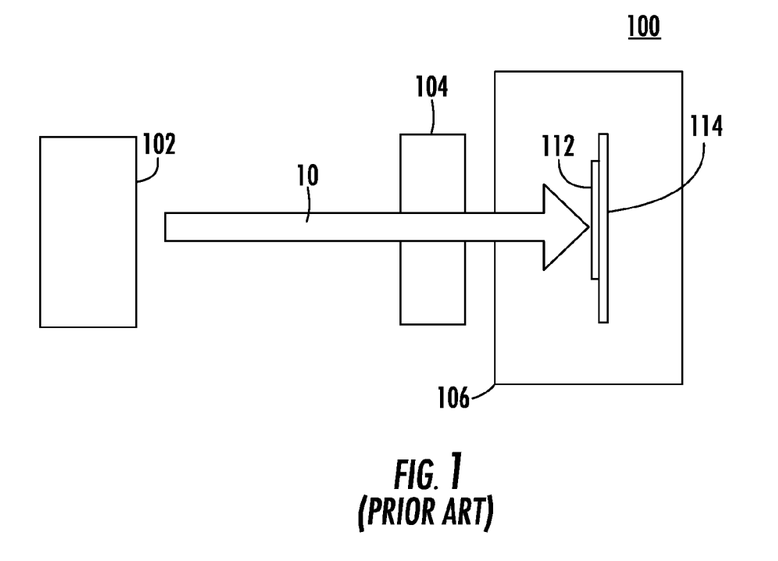
FIG. 1 illustrates a conventional beam-line ion implantation system.

In manufacturing electronic devices, dopants or impurities are introduced into a substrate to alter the substrate's mechanical, optical, or electrical property. In manufacturing memory devices, boron ions are introduced into a silicon substrate. As boron ions and silicon atoms in the crystal lattice have different electrical property, introduction of sufficient boron ions may alter the electrical property of the substrate. Among others, ion implantation technique may be used to introduce the dopants. Referring to FIG. 1, there is shown a block diagram of a typical ion implantation system 100 to perform the ion implantation. The ion implantation system 100 may comprise an ion source 102, beam-line components 104; and an end station 106. In the end station, a substrate 112 and a platen 114 supporting the substrate 112 are disposed.

In the ion source 102, feed material having desired species, such as boron, are introduced and ionized to form ions 10 of desired species. The ions 10 are then extracted from the ion source 102 and directed toward the beam-line components 104. Much like a series of optical lenses that manipulate a light beam, the beam-line components 104 can filter, focus, and manipulate the ions into an ion beam 10 having prescribed energy, and direct the ion beam 10 toward the end station 106. In the end station 106, the substrate 112 supported by the platen 114 is exposed to the ion beam 10. Typically, the substrate 112 and the platen 114 can be moved in one or more dimensions (e.g., translate, rotate, and tilt) by an apparatus, sometimes referred to as a "roplat."

A solar cell, another silicon substrate based device, may also be manufactured by introducing property altering dopants into the silicon substrate. In the past, the dopants have been introduced via diffusion process where dopant containing glass or paste is disposed on the silicon substrate. Thereafter, the substrate is heated, and the dopants are diffused into the substrate.

Although the diffusion process may be cost effective, the process has many drawbacks. In manufacturing solar cells, selective doping is performed where only certain regions of the substrate are implanted with dopants. However, selective doping process using the diffusion process may be difficult to achieve as the process is difficult to control. The process may result in imprecise doping or formation of non-uniform doping regions. In addition, voids or air bubbles, or other contaminants may be introduced into the substrate along with the dopants during the diffusion process.

To address such drawbacks, doping via ion implantation process has been proposed. In the proposed process, the substrate is coated with photoresist layer, and lithographic process is performed to pattern and expose portions of the substrate. Thereafter, the ion implantation is performed, and dopants are implanted into the exposed portions. The process, although achieves precise selective doping, is not inexpensive. Additional steps and time to coat, pattern, and remove the photoresist, each of which adds costs to the manufacturing process, are required. Any added cost in manufacturing the solar cell would decrease the solar cell's ability to generate low cost energy. Meanwhile, any reduced cost in manufacturing high-performance solar cells with high efficiency would have a positive impact on the implementation of solar cells worldwide. This will enable the wider availability and adoption of clean energy technology.

Accordingly, a new technique is needed.

SUMMARY OF THE DISCLOSURE

An improved technique for processing a substrate is disclosed. In one particular exemplary embodiment, the technique may be realized as a method for processing a substrate. The method may comprise ion implanting a substrate disposed downstream of the ion source with ions generated in an ion source; and disposing a first portion of a mask in front of the substrate to expose the first portion of the mask to the ions. The mask may be supported by the first and second mask holders. In addition, the mask may further comprise a second portion wound in the first mask holder.

In accordance with other aspects of this particular exemplary embodiment, the first and second mask holders may have at least one degree of rotational freedom.

In accordance with further aspects of this particular exemplary embodiment, the method may further comprise spinning the first and second mask holders in a first direction to unwind the second portion of the mask and disposing the second portion of the mask in front of the substrate.

In accordance with additional aspects of this particular exemplary embodiment, the method may further comprise spinning the first and second mask holders in a second direction opposite to the first direction.

In accordance with further aspects of this particular exemplary embodiment, wherein the spinning the first and second mask holders in the second direction occurs after the spinning the first and second mask holders in the first direction.

In accordance with further aspects of this particular exemplary embodiment, the spinning the first and second mask holders in the first direction occurs during the ion implanting.

In accordance with other aspects of this particular exemplary embodiment, the spinning the first and second mask holders in the first direction and the spinning the first and second mask holders in the second direction occur during the ion implanting.

In accordance with additional aspects of this particular exemplary embodiment, the spinning the first and second mask holders in the first direction occurs after the ion implanting.

Yet in accordance with other aspects of this particular exemplary embodiment, the mask may comprise metallic species.

In accordance with further aspects of this particular exemplary embodiment, the metallic species may contain at least one of aluminum (Al), silver (Ag), gold (Au), platinum (Pt), copper (Cu), iron (Fe), nickel (Ni), zinc (Zn), tungsten (W), and lead (Pb).

In accordance with additional aspects of this particular exemplary embodiment, the mask may comprise non-metallic species.

In accordance with further aspects of this particular exemplary embodiment, the non-metallic species may contain at least one of silicon (Si), polymer, graphite fiber, carbon fiber, and silicon dioxide.

In accordance with other aspects of this particular exemplary embodiment, the mask may further comprise a coating containing at least one of silicon dioxide ($SiO_2$), boron nitride (BN), silicon carbide (SiC), silicon nitride (SiN), carbon film, and silicon film.

Yet in accordance with additional aspects of this particular exemplary embodiment, the mask may be a tape mask having a plurality of apertures.

In accordance with another exemplary embodiment, the technique may be realized with an apparatus for processing a substrate. The apparatus may comprise an ion source for generating ions of desired species; a substrate disposed downstream of the ion source; and a mask unit disposed downstream of the ion source. The mask unit may comprise first and second mask holders spaced apart from one another, the first and second mask holders having at least one degree of rotational freedom; and at least one mask having first and second portions and being supported by the first and second mask holders. The first portion of the mask may be disposed upstream of the substrate, and the second portion of the mask may be wound in the first mask holder.

In accordance with other aspects of this exemplary embodiment, each of the first and second mask holders may be a bobbin.

In accordance with further aspects of this exemplary embodiment, rotation of at least one of the first and second mask holders may unwind the second portion of the mask and dispose the second portion upstream of the substrate.

In accordance with additional aspects of this exemplary embodiment, the mask may comprise metallic species.

In accordance with yet other aspects of this exemplary embodiment, the mask may comprise non-metallic species.

Yet in accordance with additional aspects of this exemplary embodiment, the mask may further comprise a coating containing at least one of silicon dioxide ($SiO_2$), boron nitride (BN), silicon carbide (SiC), silicon nitride (SiN), carbon film, and silicon film.

In accordance with further aspects of this exemplary embodiment, at least one of the first and second mask holders may comprise a groove for aligning the mask relative to the substrate.

In accordance with other aspects of this exemplary embodiment, at least one of the first and second mask holders may comprise a peg for aligning the mask relative to the substrate.

In accordance with another particular exemplary embodiment, the technique may be realized with use of a mask unit for processing a substrate. The mask unit may comprise first and second mask holders spaced apart from one another, the first and second mask holders having at least one degree of rotational freedom; and at least one mask having first and second portions and being supported by the first and second mask holders. The first portion of the mask may be disposed between the first and second mask holders, and the second portion of the mask may be wound in the first mask holder.

In accordance with other aspects of this particular exemplary embodiment, each of the first and second mask holders may be a bobbin.

In accordance with further aspects of this particular exemplary embodiment, rotation of the first and second mask holders may unwind the second portion of the at least one mask and dispose the second portion between the first and second mask holders.

In accordance with additional aspects of this particular exemplary embodiment, the at least one mask may comprise metallic species.

Yet in accordance with other aspects of this particular exemplary embodiment, the metallic species may contain at least one of aluminum (Al), silver (Ag), gold (Au), platinum (Pt), copper (Cu), iron (Fe), nickel (Ni), zinc (Zn), tungsten (W), and lead (Pb).

In accordance with yet additional aspects of this particular exemplary embodiment, the at least one mask may comprise non-metallic species.

In accordance with yet further aspects of this particular exemplary embodiment, the non-metallic species may contain at least one of carbon and silicon.

In accordance with other aspects of this particular exemplary embodiment, the non-metallic species may contain at least one of silicon (Si), polymer, graphite fiber, carbon fiber, and silicon dioxide.

In accordance with further aspects of this particular exemplary embodiment, the at least one mask may further comprise a coating containing at least one of silicon dioxide ($SiO_2$), boron nitride (BN), silicon carbide (SiC), silicon nitride (SiN), carbon film, and silicon film m.

Yet in accordance with other aspects of this particular exemplary embodiment, the at least one mask may be a tape mask having a plurality of apertures.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

DISCLOSURE

To solve the problems associated with the conventional method for processing a substrate, several embodiments of a new technique for processing a substrate are introduced. The technique may be performed using various types of systems. However, the embodiments will focus on the technique achieved with a beam-line ion implantation system for purposes of clarity and simplicity. However, those of ordinary skill in the art will recognize that other ion implantation systems or other ion generating systems may be used. Other ion implantation and ion generating systems may include, for example, spot beam ion implantation systems and plasma assisted doping (PLAD) or plasma immersion ion implantation (PIII) systems.

The embodiments, for purpose of clarity and simplicity, will also focus on the technique for processing silicon substrates for manufacturing solar cells. While silicon based solar cell substrates are mainly discussed, the present disclosure may be equally applicable to solar cell substrates containing other materials. For example, solar cell substrates containing cadmium telluride (CdTe), copper indium gallium selenide (CIGS), or other materials may also be applicable. In addition, those of ordinary skill in the art will recognize that other substrates may be used to manufacture other types of devices. Metallic, other types of semiconducting, or insulating substrates for manufacturing other electronic, optical, or other devices (e.g. memory devices) may be equally applicable to the present disclosure.

Figure 2:
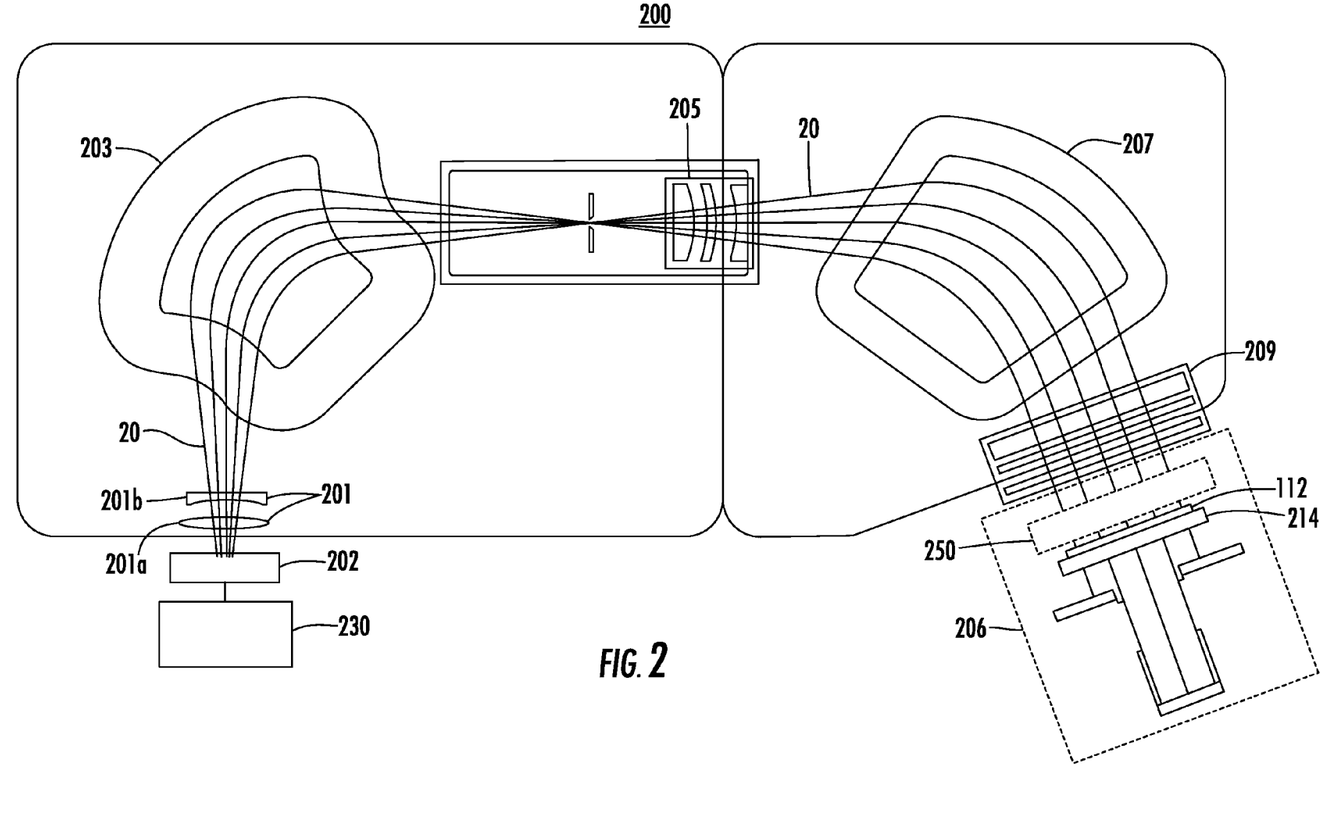
FIG. 2 illustrates a beam-line ion implantation system containing a mask unit for processing a substrate according to one embodiment of the present disclosure.

Referring to FIG. 2, there is shown a beam-line ion implantation system for processing a solar cell according to one embodiment of the present disclosure. In the present embodiment the system 200 may be a beam-line ion implanter generating ribbon shaped ion beam. However, other types of beam-line ion implantation systems or other type of ion generating system may also be used in other embodiments.

As illustrated in FIG. 2, the beam-line ion implanter 200 may include an ion source 202 for generating ions of desired species. The ion source 202 may be coupled to a gas box 230 containing feed gas of desired species. The feed gas is supplied to the ion source 202 and, thereafter, ionized. This gas may contain species with one or more elements from Group I and 3A-8A. For example, the feed gas may contain hydrogen (H), helium (He) or other rare gases, oxygen (O), nitrogen (N), arsenic (As), boron (B), phosphorus (P), antimony, gallium (Ga), indium (In), or other gases. In addition, the feed gas may contain carborane $C_2{}^B{}_{10}H_{12}$ or another large molecular compound. The ions 20 generated in the ion source 202 are then extracted by an extraction electrode 201 including a suppression electrode 201*a* and a ground electrode 201*b*. A power supply (not shown) may be coupled to the extraction electrode 201 and may provide an adjustable voltage.

The ion implantation system 200 may also comprise optional beam-line components. The components may be optional as systems in other embodiments may omit the beam-line components. If included, the optional beam-line components may include at least one of a mass analyzer 203 and an angle corrector magnet 207. The mass analyzer 203 may deflect the ions 20 based on their mass to allow ions 20 having desired mass to pass through the mass analyzer 203. The ions having undesired mass, meanwhile, may be blocked and prevented from traveling further downstream of the system 200.

The ions 20 that pass through the mass analyzer 203 may be directed toward the angle corrector magnet 207. The angle corrector magnet 207 may collimate the ions 20 traveling in a diverging path to a substantially parallel trajectory or path. In the present embodiment, diverging ion beam 20 may be collimated into a substantially parallel, ribbon shaped ion beam 20. The ion beam 20 passing through the angle corrector magnet 207 is then directed toward an end station 211 of the ion implanter 200. In some embodiments, the optional beam-line components may further comprise a first acceleration/deceleration stage 205 between the mass analyzer 203 and the angle corrector magnet 207 to accelerate or decelerate the ions in the ion beam 20. In other embodiments, the optional beam-line components may further comprise a second acceleration/deceleration stage 209 downstream of the angle corrector magnet 207 to accelerate or decelerate the ions in the ion beam 20.

The ion beam exiting the optional beam-line components may travel along an ion beam path toward the end station 206. In the end station 206, one or more substrates 112 may be positioned in the ion beam path such that the ions 20 may be implanted into the substrate 112. To control the implantation process, the end station 206 may contain various components. For example, the end station 206, similar to the convention ion implanter, may contain a platen 214 which may support the one or more substrates 112. The platen 214, in addition to supporting the substrate 112, may also control, for example, the temperature of the substrate 112 to incorporate hot or cold ion implantation. To incorporate cold ion implantation, the substrate 112 may be maintained at a temperature less than the room temperature, preferably less than 273° K. To incorporate hot ion implantation, the substrate 112 may be maintained at a temperature above the room temperature, preferably greater than 293° K. In addition to the platen 214, the ion implantation system 200 of the present disclosure may contain a pre-chilling and/or pre-heating station (not shown) where the substrate 112 may be pre-chilled or pre-heated prior to ion implantation.

The end station 206 may also contain a substrate scanner (not shown), for example, a roplat, which may position the substrate 112 in the path of the ion beam 20. In addition, the substrate scanner may translate/rotate the substrate 112 to a desired orientation with respect to the ion beam 20. In one embodiment, the substrate 112 may be oriented substantially perpendicular to the ion beam such that the ions are implanted at substantially 0° incident angle. In another embodiment, the substrate may be oriented at an angle. In one embodiment, the implant angle may be constant throughout the implantation process. In another embodiment, the implant angle may change during the implantation process. In the present disclosure, the substrate 112 may also be translated, at a desired rate, so as to control the dose of the implanted ions. To ensure proper dose the end station 306 also may include a dose measuring system.

One or more mask units 250 may also be located in the end station 206. The mask unit 250, as described below, may comprise one or more masks to provide selective ion implantation or doping. For example, a portion of the ions in the ion beam 20 may be blocked by the mask. Another portion of the ions, however, may pass through either one or more apertures contained in the mask or space between masks and may be implanted into the substrate 112. The mask unit 250, in one embodiment, may be supported by the platen 214 and/or the substrate scanner. In another embodiment, the mask unit 250 may be supported by the wall of the end station 206 wall. Although not preferable, the mask unit 250, in another embodiment, may be supported by the substrate 112. Proper orientation of the mask unit 250, or the mask contained therein, relative to the ion beam 20 and/or the substrate 112 may be provided by various components supporting the mask unit 250. For example, an actuator (not shown) may be coupled to the mask unit 250 to rotate or tilt the mask contained in the mask unit 250.

Figure 3A:
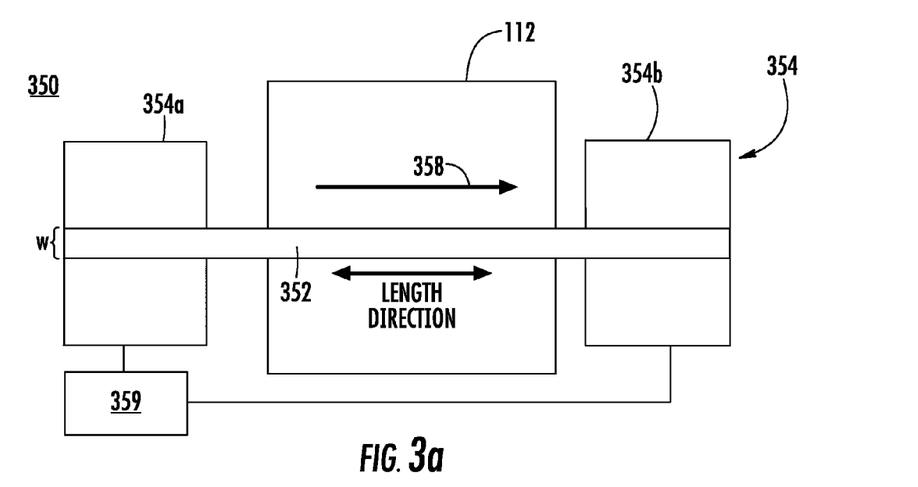
FIGS. 3a and 3b illustrates an example of the mask unit according to one embodiment of the present disclosure.
Figure 3B:
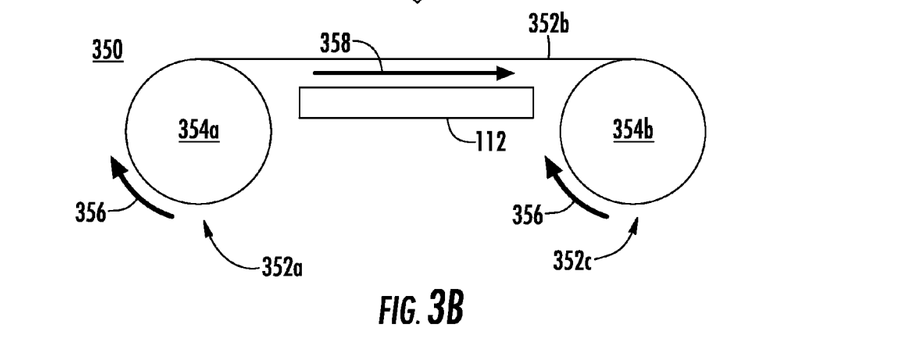

Referring to FIGS. 3*a* and 3*b*, there is shown a mask unit 350 according to one embodiment of the present disclosure.

FIG. 3a illustrates a plan view of the mask unit 350, whereas FIG. 3b illustrates a cross sectional view. As illustrated in the figures, the mask unit 350 may comprise one or more masks 352 disposed upstream or in front of the substrate 112. The mask 352 is supported by a first and second mask holder 354a and 354b that are spaced apart from one another. The mask unit 350 may optionally comprise a temperature control unit 359 coupled to at least one of the first and second mask holders 354a and 354b.

Various types of mask may be used in the present disclosure. As illustrated in FIG. 3a, the mask 352, in one embodiment, may be a wire or filament. In another embodiment, the mask 352 may be a tape having a width W larger than that of a wire or filament. The width of the mask 352, whether a wire or tape, may be constant or varying along its length direction. If the tape mask 352 is used, the mask 352 may have a width W greater than 100 μm. However, lesser or greater values are not precluded in the present disclosure. Moreover, the tape mask 352, in one embodiment, may include a plurality of apertures of having width ranging from about 75 μm to about 100 μm. Other width values are also possible.

If more than one mask 352 is supported by the first and second mask holders 354a and 354b, the masks 352 may be identical to one another. Alternatively, the masks 352 may be different in shape and/or size. For example, one of the masks 352 may be the filament mask, whereas another one of the masks 352 may be the tape mask, with or without apertures. In addition, the masks 352 may be disposed in parallel relationship, or, alternatively, at an angle. Further, the masks 352 may be disposed in the same plane, or, alternatively different planes such that the distances between substrate 112 and different masks 352 are different.

The mask 352 may be a metallic mask 352 or non-metallic mask 352. Examples of a metallic mask 352 may include aluminum (Al), silver (Ag), gold (Au), platinum (Pt), copper (Cu), iron (Fe) or steel, nickel (Ni), zinc (Zn), tungsten (W), and lead (Pb), or a combination thereof. Meanwhile, examples of a non-metallic mask 352 may include nylon, Kapton, Mylar, polymer, graphite or carbon fiber, and/or silicon (Si) or silicon containing material (e.g. glass or quartz), or a combination thereof. In one embodiment, the metallic mask 352 may be preferred due to its high mechanical strength and/or ductility. The metallic mask 352 may also be preferred, in another embodiment, as bias voltage may be applied to the mask 352. Those of ordinary skill in the art will recognize that other masks capable of conducting electricity may also be used. Those of ordinary skill in the art will also recognize the list is not exhaustive. Other suitable metallic or non-metallic mask 352 may also be used.

In one embodiment, the mask 352 may contain both metallic and non-metallic materials. Examples of such a mask may include a metallic mask 352 coated with non-metallic film, or vice versa. In the present disclosure, the coating may be, for example, silicon dioxide ($SiO_2$), boron nitride (BN), silicon carbide (SiC), silicon nitride (SiN), carbon film, and silicon film. However, other coating materials are not precluded. In some embodiments, the coating may be a sacrificial coating that may be sputtered onto the substrate 112. Further, if Kapton tape is used as the mask 352, the tape may also contain one or more apertures that are approximately 75-100 μm wide and that selectively introduce ions from the ion beam 20 through the apertures.

As noted above, the mask 352 may be supported by the first and second mask holders 354a and 354b. In the present embodiment, each of the mask holders 352 may be a bobbin or spool. As illustrated in FIG. 3b, a first portion of the mask 352a may be disposed and wound in the first holder 354a. Meanwhile, a second portion of the mask 352b may be disposed upstream or above the substrate 112. A third portion of the mask 352c may be disposed on the second holder.

In the present embodiment, each of the mask holders 354a and 354b may have at least one degree of rotational freedom. In particular, each of the mask holders 354a and 354b may rotate or spin along the arrow 356 indicated in FIG. 3b. Although the figure illustrates only one rotational direction, those of ordinary skill in the art will recognize that each mask holders 354a and 354b may rotate in opposite direction. As they rotate, the mask holders 354a and 354b may maintain the mask 352 in tension or move the mask along a direction shown by the arrow 358 or opposite direction.

In the present disclosure, each of the mask holders 354a and 354b may rotate independently. For example, both mask holders 354a and 354b may rotate in the same direction, at same or different rates. In another example, each mask holder 354a and 354b may rotate in opposite direction, at same or different rates, until further rotation is prevented by the mask 352. Yet in another example, one of the mask holders 354a and 354b may rotate while the other one of the mask holders 354a and 354b is stationary.

In one embodiment, the holders 354a and 354b may be disposed behind or downstream of the substrate 112 to protect the holders 354a and 354b from the extreme condition of the ion beam 20. In another embodiment, a barrier (not shown) may also be provided between the ion beam 20 and the mask holders 354a and 354b to shield and protect the holders 354a and 354b. Yet in another embodiment, the holders 354a and 354b may simply be located at a far distance, away from the ion beam 20, such that they will not be adversely affected.

To provide proper alignment of the mask 352 relative to the substrate 112, at least one of the mask holders 354a and 354b may optionally include one or more grooves or pegs (not shown). The groove or pegs may limit the lateral movement of the mask 352 (e.g. along the direction transverse to the direction shown by arrow 358). If a tape mask comprising a plurality of apertures is used, one or more bumps (not shown) may be provided in at least one of the mask holders 354a and 354b. The bumps, which may be inserted into the apertures of the mask 352, may also limit the lateral movement. Those of ordinary skill in the art will recognize that other alignment techniques may also be used to align the mask relative to the substrate 112.

Although not required, the temperature control unit 359 may be provided. In one embodiment, the temperature control unit 359 may provide a cooling/heating agent to the mask holders 354a and 354b to regulate the temperature of the mask 25 in the mask holders 354a and 354b. In that embodiment, the cooling/agent in fluid form (e.g. liquid or gas) is preferred. For example, the temperature control unit 359 may provide water to the mask holders 354a and 354b to prevent the mask holders 354a and 354b and the mask 352 from over heating. However, the temperature control unit 359, in other embodiments, may regulate the temperature of the mask holders 354a and 354b and the mask 352 via other schemes.

In operation, the mask 352 is disposed upstream or in front of the substrate 112. Although it is preferable that the mask 352 is spaced apart and does not contact the substrate 112, contacting the mask 352 and the substrate 112 is not precluded. Thereafter, the ions 20 are directed toward the substrate 112. Depending on the shape and size of the mask 352, a portion of the ions 20 may be blocked while another portion of the ions may pass and be implanted into the substrate 112.

In the present embodiment, only a small portion of the mask 352 is exposed to the ions 20 at any given time. Other portions are disposed or wound in the first and/or second mask holders 354a and 354b. During ion implantation, one or more of the mask holders 354a and 354b may rotate or spin, move the mask, 352 and introduce the other portions into the ion beam path. As such, any given portion of the mask 352 is not exposed to the ions 20 for an extended period of time. In a particular example, the mask holders 354a and 354b may rotate continually (e.g. continuously or in steps) during ion implantation along the direction shown by arrow 356. A portion of the mask 352 disposed or wound in the first mask holder 352a may move along the direction shown 358 and into the ion beam path (i.e. in front of the substrate 112). Meanwhile, another portion of the mask 352 that was previously in the ion beam path may move and be disposed in the second mask holder 354b. In the second mask holders 354b, cooling, for example, may be provided by the temperature control unit 359. After a period of time, the mask holders 354 and 354b may rotate in the opposite direction. The portion of the mask 352 in the second mask holder 354b may move into the ion beam path and to the first mask holder 354a. The process may be repeated throughout the entire implantation process. By continually rotating the mask holders 354a and 354b and moving the mask 352 in one or more directions, there may be continual replacement of the mask 352 in the ion beam path. Although not preferred, the mask holders 354 and 354, in another embodiment, may rotate between two ion implantations.

Moving the mask 352 and avoiding extended exposure to the ions may provide several advantages. For example, excessive thermal expansion of the mask 352 due to extended exposure to the ions may be avoided. The excessive thermal expansion may adversely affect the fidelity or the resolution of the implanted regions in the substrate 112. By moving the mask 532 in and out of the ion beam path, the present embodiment may limit the thermal expansion. Additional cooling provided in the mask holders 354a and 354b may further limit the thermal expansion. In addition to reducing the possible thermal expansion, excessive wear and tear of the mask 352 may also be avoided. Further, the ion implantation system 200 downtime for replacing the entire mask 352 may be reduced.

In the present disclosure, the rate by which the holders 354a and 354b rotate may depend on various parameters. In one example, the rate may depend on the condition of the mask 352. The holders 354a and 354b may rotate at high velocity to avoid excessive wear and tear or depletion of the coating on the mask 352. In another example, the rate may depend on the temperature of the mask 352. For a mask having a small width, the mask 352 may move, for example, approximately 1 m/s, and the holders 354a and 354b may rotate to accommodate such a movement. For a mask 352 having larger width and larger thermal mass, the mask 352 may move at a lower speed, and the holders 354a and 354b may rotate to accommodate the lower speed.

Figure 4:
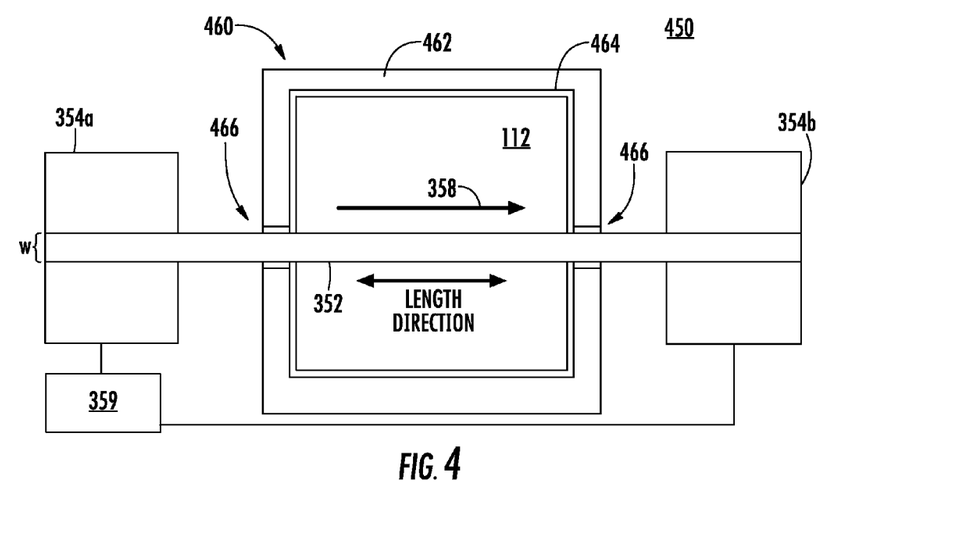
FIG. 4 illustrates another example of the mask unit according to another embodiment of the present disclosure.

Referring to FIG. 4, there is shown a mask unit 450 according to another embodiment of the present disclosure. In the present embodiment, the mask unit 450 comprises one or more masks 352 and the mask holders 354a and 354b. In addition, the mask unit 450 comprises an alignment assembly. Those of ordinary skill in the art will recognize that many of the components contained in the mask unit 350 of the earlier embodiment are also contained in the mask unit 450 of the present embodiment. As such, the description of the mask unit 450 of the present embodiment should be read in light of the mask unit 350 described earlier. For purpose of clarity and simplicity, the description of the components described earlier may be omitted.

The alignment assembly 460, in the present embodiment, may be a substrate carrier 460 for supporting one or more substrates 112. In one embodiment, the carrier 460 may be disposed on the platen 114 supporting one or more substrates 112. Alternatively, one or more platens 114 may be disposed on the carrier 460. As illustrated in FIG. 4, the carrier 460 may contain a protrusion 462 and one or more recessed regions 464. In one or more recessed regions 464, one or more substrates 112 may be disposed to align the one or more substrates 112 to the carrier 460 and/or the ion beam 20. The alignment assembly 460 may also comprise one or more grooves 466, through which one or more masks 352 may pass. The groove 466 may limit the lateral movement of the mask 352 and align the mask 352 relative to one or more substrates 112.

Figure 5:
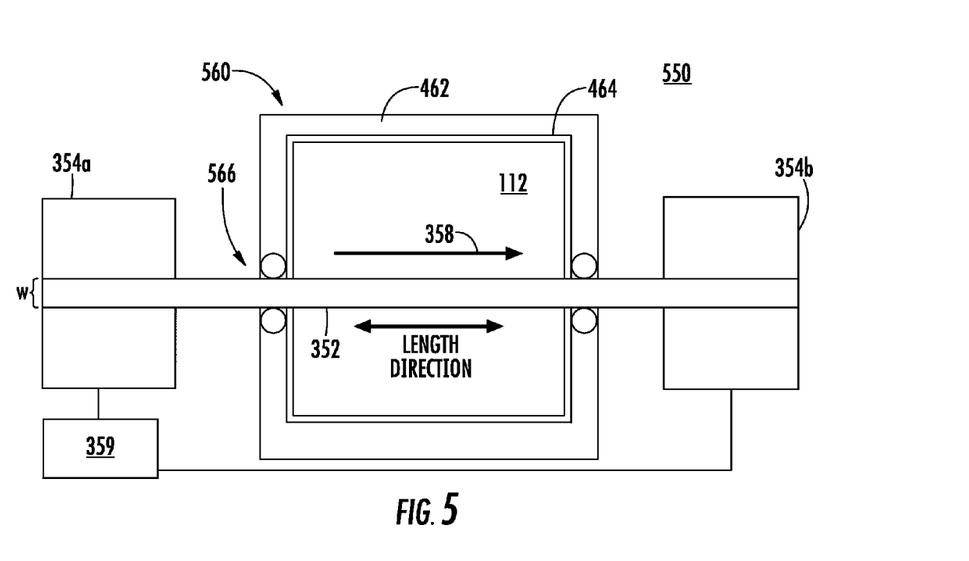
FIG. 5 illustrates another example of the mask unit according to another embodiment of the present disclosure.

Referring FIG. 5, there is shown a mask unit 550 according to another embodiment of the present disclosure. In the present embodiment, the mask unit 550 comprises one or more masks 352 supported by the first and second mask holders 354a and 354b. In addition, the mask unit 550 comprises an alignment assembly 560. Those of ordinary skill in the art will recognize that many of the components contained in the mask unit 350 of earlier embodiments are also contained in the mask unit 550 of the present embodiment. As such, the description of the mask unit 550 of the present embodiment should be read in light of the mask unit 350 described earlier. For purpose of clarity and simplicity, the description of the components described earlier may be omitted.

The alignment assembly 560, in the present embodiment, may be a substrate carrier 560 for supporting one or more substrates 112. In one embodiment, the carrier 560 may be disposed on the platen 114 supporting one or more substrates 112. Alternatively, one or more platens 114 may be disposed on the carrier 460. As illustrated in FIG. 5, the carrier 560 may contain a protrusion 562 and one or more recessed regions 564. In one or more recessed regions 564, one or more substrates 112 may be disposed to align the one or more substrates 112 to the carrier 560 and/or the ion beam 20. In addition, the alignment assembly 560 comprises a plurality of pegs 566. As illustrated in the figure, the pegs 566 may align the mask 352 and the substrate 112, and enable correct positioning of the mask 352 with respect to desired regions of the substrate 112.

Figure 6:
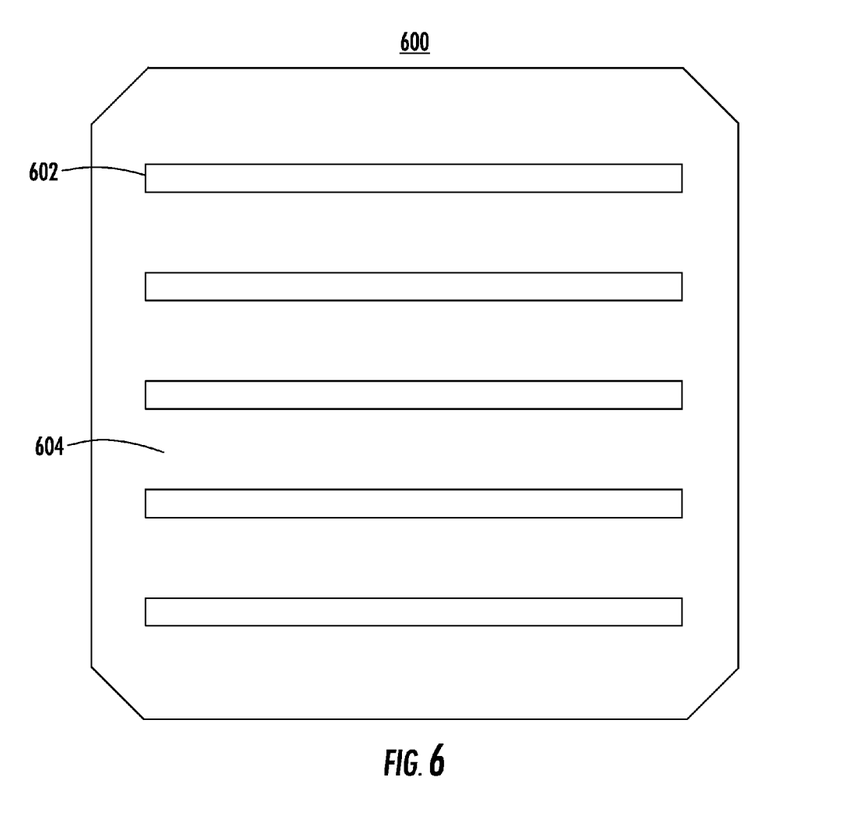
FIG. 6 illustrates a solar cell that may be processed using the mask unit of the present disclosure.

Referring to FIG. 6, there is shown a substrate 600 that may be processed using the technique described in the present disclosure. In the present embodiment, the substrate 600 may be a silicon substrate 600 processed with the ion implantation system 200 and one of the mask units 350, 450, and 550, described in earlier embodiments.

On the surface of the solar cell 600, there may be one or more first and second doped regions 602 and 604 sequentially positioned. In one embodiment, the first and second doped regions 602 and 604 may be those of different conductivity type. For example, the first doped region 602 may be a p-type region and the second doped region 604 may be an n-type region. In another embodiment, the first and second doped regions 602 and 604 may be of the same conductivity type, but different conductivity level. For example, both the first and second doped regions 602 and 604 may be n-type regions. However, one of the regions 602 may have greater percentage of n-type dopants. The latter embodiment may be achieved by implanting more dopant into one of the regions 602 and 604. Alternatively, the embodiment may be achieved by counter-doping one of the regions 602 and 604 with dopants with opposite conductivity type (e.g. p-type dopants). In the present embodiment, the first and second doped regions 602 and 604 are both n-type. However, the first doped region 602 may have a higher conductivity level than the second doped region 604. A metal line having a width ranging from about 110 μm to about 120 μm may be formed on the first doped region 602.

To form the first region 602 with greater n-type conductivity level, the entire surface of the substrate may be doped with n-type dopants. Thereafter, the first regions 602 may be selectively doped. In the present embodiment, the selective doping may be achieved with an ion implantation system 200 described in the earlier embodiments. In particular, the mask 352 may be disposed upstream or in front of the region representing the second doped regions 604. Thereafter, n-type ions 20 from the ion source 202 may be implanted into the first region 602. In another embodiment, the entire surface of the substrate may be doped with n-type dopants. Thereafter, the mask 352 may be disposed above the region representing the first doped region 602, and the region representing one or more second regions 604 may be counterdoped with p-type dopants. Yet in another embodiment, selective doping may be performed. For example, the mask 352 may be disposed over the region representing the first doped region 602. The region representing the second doped region may then be doped to a desired level. Thereafter, the mask 352 may be disposed over the region representing the second doped region 604, and the region representing the first doped region 602 may be doped. As noted above, the mask holders 354a and 354b supporting the mask 352 may rotate during ion implantation or between ion implantations.

In the present disclosure, a novel technique for processing a substrate, for example a solar cell, is disclosed. The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method for processing a substrate, the method comprising:
    ion implanting a substrate disposed downstream of an ion source with ions generated in the ion source; and
    disposing a first portion of a mask in front of the substrate to expose the first portion of the mask to the ions, the mask being supported by the first and second mask holders, the mask further comprising a second portion wound in the first mask holder.

2. The method according to claim 1, wherein the first and second mask holders have at least one degree of rotational freedom.

3. The method according to claim 1, further comprising: spinning the first and second mask holders in a first direction to unwind the second portion of the mask and disposing the second portion of the mask in front of the substrate.

4. The method according to claim 3, further comprising: spinning the first and second mask holders in a second direction opposite to the first direction.

5. The method according to claim 4, wherein the spinning the first and second mask holders in the second direction occurs after the spinning the first and second mask holders in the first direction.

6. The method according to claim 3, wherein the spinning the first and second mask holders in the first direction occurs during the ion implanting.

7. The method according to claim 5, wherein the spinning the first and second mask holders in the first direction and the spinning the first and second mask holders in the second direction occur during the ion implanting.

8. The method according to claim 3, wherein the spinning the first and second mask holders in the first direction occurs after the ion implanting.

9. The method according to claim 1, wherein the mask comprises metallic species.

10. The method according to claim 9, wherein the metallic species contains at least one of aluminum (Al), silver (Ag), gold (Au), platinum (Pt), copper (Cu), iron (Fe), nickel (Ni), zinc (Zn), tungsten (W), and lead (Pb).

11. The method according to claim 1, wherein the mask comprises non-metallic species.

12. The method according to claim 11, wherein the non-metallic species contains at least one of silicon (Si), polymer, graphite fiber, carbon fiber, and silicon dioxide.

13. The method according to claim 1, wherein the mask further comprises a coating containing at least one of silicon dioxide (SiO.sub.2), boron nitride (BN), silicon carbide (SiC), silicon nitride (SiN), carbon film, and silicon film.

14. The method according to claim 1, wherein the mask is a tape mask having a plurality of apertures.

* * * * *